United States Patent
Morton

(10) Patent No.: US 6,313,453 B1
(45) Date of Patent: Nov. 6, 2001

(54) GLASSMASTERING PHOTORESIST READ AFTER WRITE METHOD AND SYSTEM

(75) Inventor: Edward W. Morton, Turnersville, NJ (US)

(73) Assignees: Sony Corporation, Tokyo (JP); Sony Electronics, Inc., Park Ridge, NJ (US)

(*) Notice: Subject to any disclaimer, the term of this patent is extended or adjusted under 35 U.S.C. 154(b) by 0 days.

(21) Appl. No.: 09/430,127

(22) Filed: Oct. 29, 1999

Related U.S. Application Data

(62) Division of application No. 09/076,100, filed on May 12, 1998, now Pat. No. 6,025,118.

(51) Int. Cl.[7] .................................................. G02B 7/04
(52) U.S. Cl. ........................... 250/201.5; 250/559.4; 369/44.38; 369/53.12
(58) Field of Search ............................. 250/201.5, 568, 250/559.11, 559.4, 238; 369/44.31, 44.38, 44.14, 120, 112, 53.12–53.17; 356/305, 225

(56) References Cited

U.S. PATENT DOCUMENTS 5,659,536 * 8/1997 Maillot et al. .................... 369/275.1

* cited by examiner

Primary Examiner—Que T. Le
(74) Attorney, Agent, or Firm—Ronald P. Kananen; Rader, Fishman & Grauer

(57) ABSTRACT

A method of manufacturing an optical disc master from a glass substrate includes coating the substrate with a layer of photoresist, and applying an alkali-gel layer atop the photoresist. The coated substrate is then placed in an environment with a higher than normal humidity. The surface of the coated glass is selectively exposed to a beam of a writing laser, the exposure being controlled by digital information to be recorded on the disc. Exposed portions of the coated substrate experience a chemical reaction between the photoresist and the alkali material in the humid environment. Exposed portions are then developed and ablated thereby creating the pits and lands.

9 Claims, 4 Drawing Sheets

A = HIGH EXPOSURE
B = LITTLE EXPOSURE
C = NO EXPOSURE

GLASSMASTERING PHOTORESIST READ AFTER WRITE METHOD AND SYSTEM

This application is a divisional of application Ser. No 09/076,100 filed May 12, 1998, now U.S. Pat. No. 6,025,118.

FIELD OF THE INVENTION

The present invention relates to the field of optical disc manufacturing. More specifically, the present invention relates to a glassmastering photoresist method and system making use of a read-after-write approach for inspecting and insuring master quality.

BACKGROUND OF THE INVENTION

Disc-shaped recorded media, for example an optical disc or a magneto-optical disc, utilizing the method of optical or magneto-optical signal recording and reproducing, are well known in the art. The various types of such disc-shaped recording media include: (1) recording media of the read-only-memory (ROM) type, e.g., an audio compact disc (CD) or a CD ROM, (2) write-once type recording media on which data can be written only once by the user, and (3) overwrite type recording media, such as a magneto-optical disc, on which data re-recording is possible. Other well known examples of optical recording media are video CDs, CD-I, CD-MO, MD, etc.

In order to mass produce optical discs a master disc is produced through a mastering process. This mastering process involves a basic sequence of processing steps. The sequence starts with providing a circular glass substrate that must be cleaned and dried and then carefully inspected for imperfections, surface smoothness and the like. An adhesive coating layer is then placed on one surface of the glass to exacting tolerances. The adhesive coating layer is followed by a photoresistive coating layer evenly and continuously applied over the adhesive layer over the entire glass substrate surface.

The glass substrate must then be appropriately cured, after which recording with an optical beam takes place. The recording process involves selectively exposing the photoresistive coating to a beam of light from a light source in order to form the appropriate pattern of pits and lands which represent the data recorded on the disk. If the light source is a laser, it is typically of a continuous wave type, with exposure of its beam to the photoresistive coating conventionally controlled by an acousto-optical modulator (AOM).

The AOM acts as an electronic shutter to the laser beam and, as is well-known by those skilled in the art, is controlled by a string of binary 1's and 0's generated by an encoder. The encoder converts, for example, stereo audio signals typically recorded digitally on a tape in a video or audio format to the appropriate binary 1's and 0's by performing eight-to-fourteen modulation (EFM). As part of this encoding, the encoder generates so-called RS parity bytes and adds merging bits.

After the photoresist has been selectively exposed to the laser, the photo-resistive coating must be developed so that the exposed portions can be removed. Developing is accomplished by placing the substrate in a caustic sodium hydroxide solution. After developing, the glass must be inspected by measuring, among other things, the diffraction orders of the tracks.

The next step, metalization, involves placing a thin coating of silver or nickel over the entire surface of the substrate. This metalization cover follows the pattern of pits and lands of the now developed photo-resistive layer. In the case of silver, the metalization step is accomplished by a well known evaporation process resulting in the formation of a metal coating typically 120 nanometers thick. At this point, the metalized substrate, or the "glass master," is typically "played" in a specially adapted CD player to insure that the pits have been properly formed.

A nickel plating is then formed via electroplating over the metalized glass substrate such that a metal master is formed when the nickel plating is removed from the substrate. The metal master has pits and lands which are the inverse of those on the metalized glass plate. This metal master is called a "father" and is created by well-known electroplating procedures. Because the extremely thin silver or nickel metalization forming the glass master adheres to and is removed with the nickel plating of the father, there can only be one father.

From the metal master or father, a so-called "mother" is formed, also out of nickel. The mother is simply the inverse of the metal master or father and is similarly formed by electroplating. Several mothers can be formed from the metal master or father.

Finally, nickel stampers are formed from the mothers. The stampers carry the pattern of the father and are again simply the inverse of the mother. Nickel stampers are formed by electroplating a mother in the same way a mother is formed from the father. From the stampers, compact discs can be manufactured by injecting molten molding resin, e.g., optical quality polycarbonate, at high pressure into a mold comprising the stamper and allowing it to solidify.

SUMMARY OF THE INVENTION

The object of the invention is to provide a glassmastering photoresist read-after-write method and system that, while keeping all the advantages of the prior art methods and systems, would at the same time be free of their deficiencies.

According to the present invention, a method for manufacturing an optical disc master is provided in which a stream of digital information is converted to a plurality of pits and lands representing the digital information in the optical disc master. The method starts by providing a glass substrate that is then coated with a layer of photoresist. After that, a layer of alkali material is applied atop the glass substrate with the layer of photoresist thereon. The glass substrate coated with the photoresist layer and alkali layer on top of it is placed in an environment with a higher than normal humidity. Preferably, the higher than normal humidity is about 90+ RH.

Next, the surface of the coated glass is exposed to a writing beam from a light source which is controlled by the digital information to be written to the disc. In the course of this controlling, a focal point of the writing light beam moves relative to the surface in a pattern so as to allow for formation of the pits and lands. To optimize pit and land geometry, the writing laser beam may be adjusted.

A chemical interaction is initiated at exposed portions of the coated substrate between an exposed photoresist and the alkali material in the humid environment. According to the present invention, the exposed portions are developed and ablated thereby creating the pits, whereas unexposed portions of the coated substrate are kept unaltered thereby creating the lands.

To enhance the bond between the glass substrate and the photoresist layer, a barrier layer material is applied between the glass substrate and the layer of photoresist. The barrier layer on top of the glass substrate is preferably deposited by spin coating.

Preferably, the barrier layer material is titanium acetyl acetonate. Preferably, the alkali material is NaOH. Alternatively, the alkali material can be KOH.

To enhance adhesion of the alkali material to the photoresist layer, the alkali material is combined with an adhesion promoter. Preferably, the adhesion promoter is an optically clear gel, and the thickness of the layer of alkali material combined with the adhesion promoter is selected to be about 120 nm. Alternatively, the thickness of a layer of the alkali material combined with the. adhesion promoter may be more than 120.

The moving of the focal point of the writing light beam relative to the coated substrate is accomplished by rotating the coated substrate and simultaneously translating the writing light beam radially. A linear velocity of the moving of the focal point relative to the coated substrate is constant.

Preferably, the writing light beam is a blue or UV laser beam, and a radiation wavelength range thereof is selected between about 351 nm and about 458 nm. Alternatively, the writing light beam may be a blue beam of a LED with a radiation wavelength range between about 442 nm and about 458 nm.

Also, the photoresist preferably comprises a combination of Novolac and diazide, the diazide transforming into a ketene component with the releasing of a gaseous nitrogen component in response to the exposure to the writing light beam. The chemical interaction caused by the writing light beam further comprises formation of an organic acid from the ketene component and water, with subsequent formation of an organic salt from the organic acid and the alkali material.

A reading light source operating from the bottom of the glass structure can also be provided after the exposure. The beam of the reading light source is provided at an appropriate energy and intensity so that it cannot expose the photoresist layer. A couple of photodetectors means are provided to receive the reading beam as transmitted through the glass master.

The first photodetector is in alignment with the reading beam, whereas the second photodetector is shifted relative to the first photodetector so as to detect diffraction of the reading beam. A focal point of the reading beam is moved relative to the glass substrate in a second pattern as the focal point of the writing beam is controlled. Thus, the reading beam determines whether a particular portion of the photoresist has been developed.

The reading light source is preferably a red HeNe laser radiating at a wavelength of about 635 nm. Alternatively, the reading light source can be a red LED radiating at a wavelength of about 635 nm. The diffraction of the reading beam detected by the second photodetector is preferably a first order diffraction. For that reason, the second photodetector may be positioned about 23° of the optical axis of the first photodetector.

To ablate the exposed portions of the substrate coating, wet vacuum is applied to the coated substrate and moved over the entire coated substrate.

A system for recording information in a read-after-write process of making optical discs comprises according to the present invention: a glassmaster, a recording chamber accommodating the glassmaster, first light emanating means for writing information on the glassmaster, and second light emanating means for reading the information written by the first writing means.

The glassmaster comprises a glass substrate coated with a first layer of a photoresist and with a second layer of an alkali material, the second layer being applied atop the first layer. There is humidity created in the recording chamber, the level of the humidity being sufficient enough to condense water atop the layer of alkali material. The information being written on the glassmaster is a representation of digital information to be recorded on the optical discs. The digital information controls the first light emanating means so that it exposes the photoresist in accordance therewith. There is also a photodiode couple cooperating with the second light emanating means.

BRIEF DESCRIPTION OF THE DRAWINGS

These and other objects, features and advantages of the present invention will be best understood from the ensuing description thereof when considered in conjunction with the accompanying drawings, in which

FIG. 2 illustrate photoresist exposure, with FIG. 2a showing an exposure distribution of a concrete portion of the glass master photoresist substrate, and FIG. 2b demonstrating the portion of the glass substrate exposed in accordance with the distribution of FIG. 2a;

DETAILED DESCRIPTION OF THE INVENTION

Figure 1:
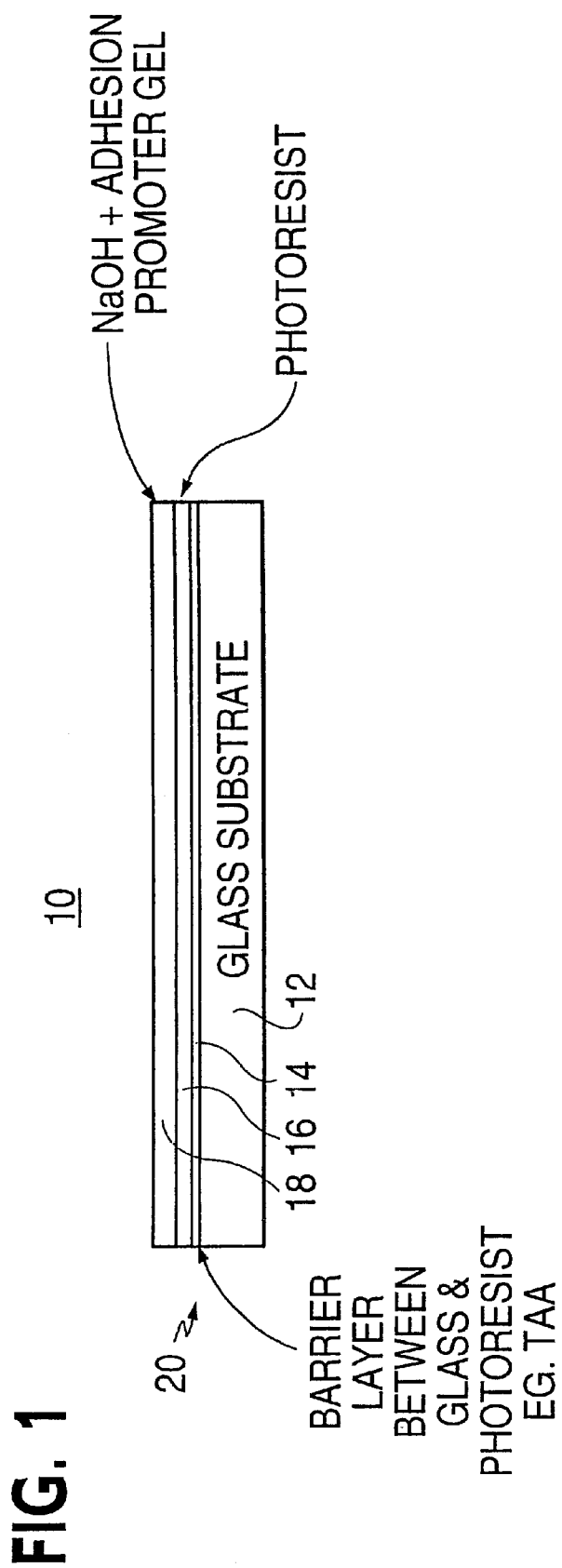
FIG. 1 depicts a glassmaster photoresist substrate according to the present invention.

FIG. 1 illustrates a glassmaster photoresist substrate 10 with which the present invention will now be described. The glassmaster substrate 10 comprises a glass substrate 12 which is a finely polished glass disc of about 200 or 240 mm in diameter and 5.9 mm thick. The disc 12 is spin coated with a barrier layer 14 preferably made of titanium acetyl acetonate (TAA).

On top of the TAA layer 14, a layer 16 of a photoresist material is applied, the photoresist being of a diazide type. The total thickness of the TAA barrier layer 14 and the photoresist layer 16 being about 120 nm.

The selection of a specific type of photoresist is governed by its sensitivity to radiation in a first spectrum region, or range (in which the writing light source is supposed to operate), and insensitivity to radiation in a second range (in which the reading light source is supposed to operate). Specifically, a Shipley Microposit S1800 Series photoresist is believed to be particularly convenient for the purposes of the present invention.

The particular photoresist comprises photosensitive molecules of diazide mixed with Novolac, a phenol formaldehyde resin well known in the art. The photoresist is relatively sensitive in the 300 to 495 nm wavelength range and is not responsive for 500 nm and greater wavelength.

The TAA layer 14 plays the role of an adhesion promoter. It adheres to the glass substrate 12, and then retains the photoresist layer 16 thereon, to thus secure a reliable bond between the photoresist layer 16 and glass substrate 12. The TAA layer 14 is optically clear so as not to eclipse a reading laser beam emanating from the bottom of the glass substrate 12.

After applying the photoresist layer 16, the disc 20 is cured at about 80° C. for about half an hour. Then, a layer 18 of an alkali material, preferably sodium hydroxide NaOH mixed with a water soluble and optically clear gel, of a total thickness of about 120 nm or more, is added and evenly spread atop the photoresist layer 16. Alternatively, potassium hydroxide KOH can be used as an alkali material. The function of the gel is to retain the alkali material on the surface of the photoresist layer.

Figure 3:
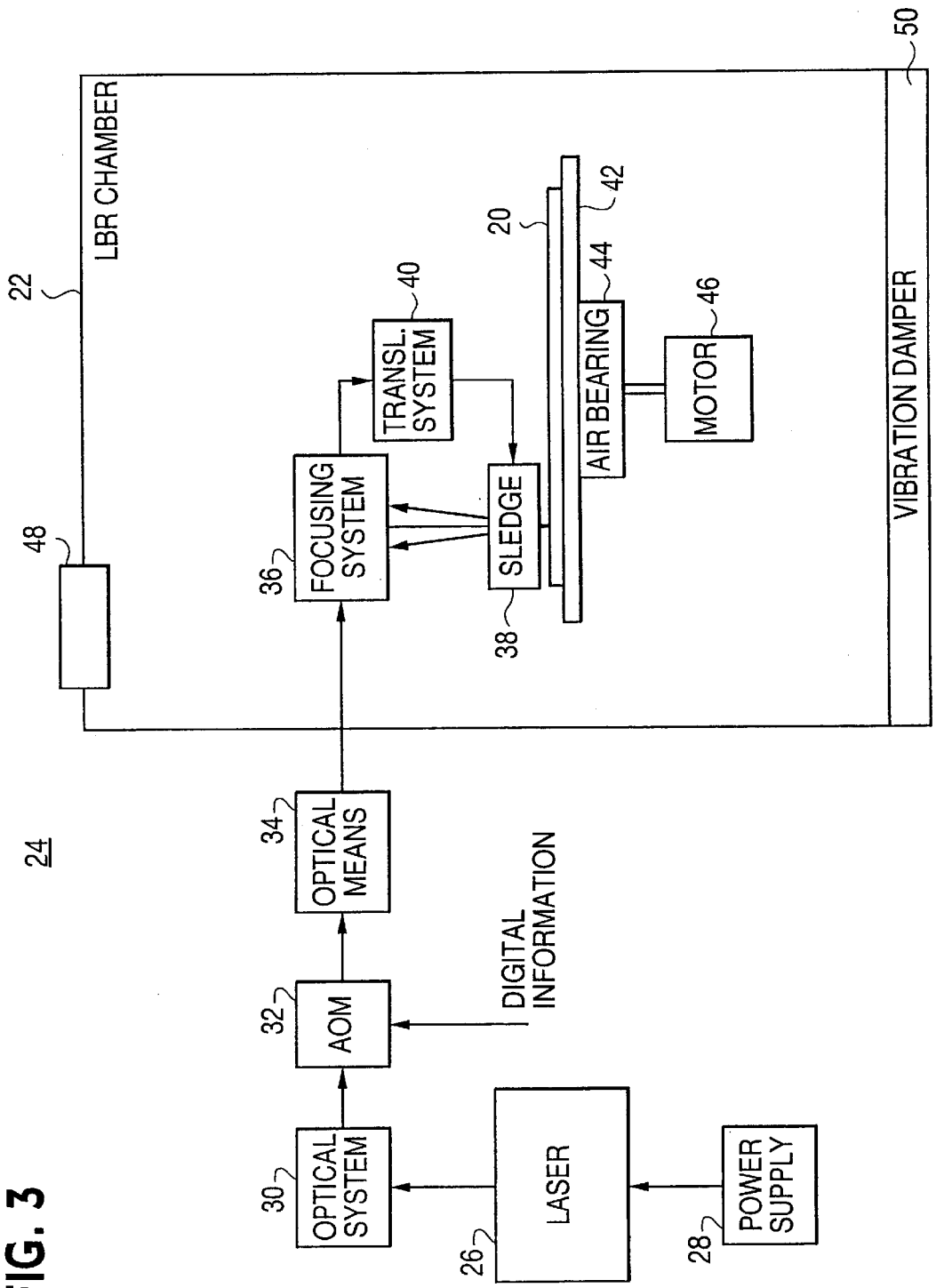
FIG. 3 diagrammatically represents an arrangement of an optical recording apparatus for practicing the method according to the present invention.

This semi-finished product that is referred to as a resist master 20 and is comprised of the glass substrate 12 and the layers 14, 16, and 18 of TAA, photoresist, and the NaOH-gel blend, respectively. The resist master 20 is then ready to be mounted in a read-after-write laser beam recording (LBR) chamber 22 schematically depicted in FIG. 3.

The LBR chamber 22 is a part of a conventional optical recording apparatus 24 where a laser beam for recording is emitted from a laser beam source such as a blue argon-ion laser 26 with a wavelength of between about 351 nm and about 458 nm. The laser 26 is fed from a power supply 28. The beam passes through an optical system 30 that comprises means for controlling beam intensity and deflection, modulating means 32, and optical means 34 that lets the laser beam through to the LBR chamber 22. The modulating means 32 which is an AOM is controlled by the digital information to be recorded on the disc.

The LBR chamber 22 comprises a focusing system 36, a sledge 38 carrying an objective (not shown), a translation system 40, and a rotating table 42 with the glass master 20 mounted thereon. Movement of the sledge 38 is controlled by the translation system 40 receiving commands from the focusing system 36 that is servo controlled and conventionally uses a reflected light for focusing purposes.

The rotating table 42 rests on an air bearing 44 and is set into rotation by a motor 46. A vibration damper 50 supports the LBR chamber 22 and damps vibrations of the chamber. A humidifier 48 controls the humidity in the LBR chamber 22. The humidifier 48 may include an air filter 48. A higher than normal humidity of about 90+ RH is provided in the LBR chamber 22 so as to assure a layer of water to be on top of the glass master 20 that is refreshed continuously. Specifically, the glass master 20 can be kept in the LBR chamber 22 at a cold temperature to promote water condensation on top of the NaOH-gel mixture.

During the recording process, the blue writing laser beam radiates over the surface of the glass master 20 exposing some sections of the surface and not exposing the others, in accordance with the digital information controlling the laser radiation. The laser's exposure energy H is proportional to laser intensity I W/m$^2$ (or J/s/m$^2$) and the time of exposure, and inversely proportional to linear velocity which is selected to be about 1.2–1.4 m/s.

Acting on the photoresist, the writing laser forms pit latent images. Those sections exposed to the laser beam undergo the reaction of interaction between laser light beam photons and the diazide with the formation of ketene and gaseous nitrogen:

Novolac+Diazide+Photons→Ketene+N$_2$↑+Novolac

Water from the surface of the coated glass substrate 20 reacts with the ketene in the formation of an organic acid:

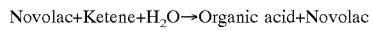
Novolac+Ketene+H$_2$O→Organic acid+Novolac and the organic acid reacts with the alkali solution, NaOH in the case, in the formation an organic salt and water where pits are located:

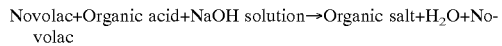
Novolac+Organic acid+NaOH solution→Organic salt+H$_2$O+Novolac

No such reactions occur at the sections not exposed to the writing laser beam. A "wet" vacuum system 52 provided in the LBR chamber 22 removes the residual dissolved salt, gel, water and Novolac.

Figure 2A:
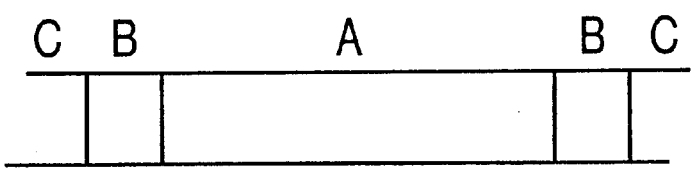
Figure 2B:
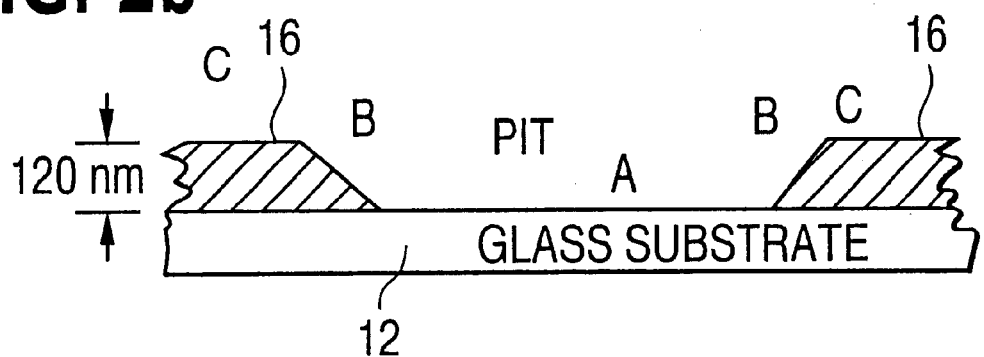

The correlation between the exposure energy and the developed photoresist relief can be vividly seen in FIGS. 2a and 2b where high, little, and no exposure are converted into areas A, B, and C corresponding to a pit, a transition area, and a land, respectively.

Figure 4:
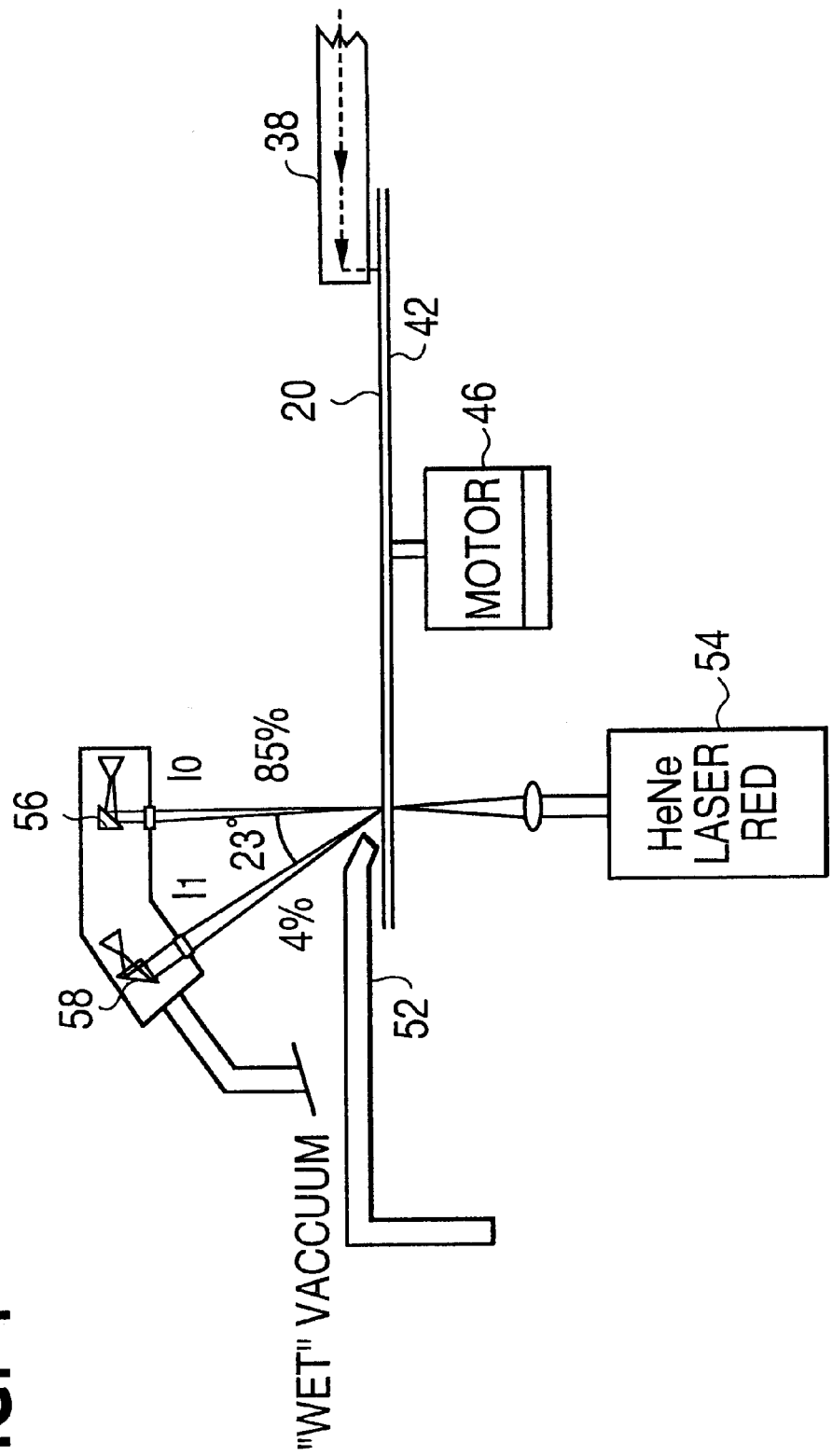
FIG. 4 diagrammatically represents a part of the optical recording apparatus showing a reading laser and a photodiode couple.

Also, as shown in FIG. 4, a reading laser 54 and a photodiode pair 56, 58 are provided. The red reading HeNe laser 54 radiates at the 635 nm wavelength and thus cannot expose the photoresist which, as previously discussed, is insensitive to radiation at wavelengths higher than 500 nm. Shining from underneath the glass master 20 being developed, the reading laser 54 creates a spot of light of about 50 μm in diameter on the photoresist surface that is received by both photodiodes 56, 58.

One of the photodiodes 56 is in direct alignment with the reading red laser. The other photodiode 58 is shifted at a predetermined angle to determine, using the first order diffraction red laser intensity value, when pits have been etched out, signifying that the particular section of the glass master 20 is developed.

The reading laser beam shown through an evenly spaced row of pits (track pitch is about 1.6 μm) will be diffracted at specific angles—depending on the wavelength of the laser light source. As an example, when using 635 nm HeNe red laser light, that angle is 0 degrees for zero order and 23 degrees for first order diffraction. Therefore, the second photodiode 58 is disposed 23° off the optical axis of the first photodiode 56. Intensity values picked up from the photodiodes (about 85% of light beam intensity comes to the first photodiode 56 (as $I_0$) and about 4% comes to the second photodiode 58 (as $I_1$)) can be used to provide a feedback to control the intensity of the writing blue laser beam.

The reading laser 54 will also need a focusing system, a sledge and a translation system (all not shown), similar to those 36, 38 and 40 used for the writing laser 26.

Also, the writing blue laser intensity can be adjusted to assure optimum pit geometry during the cutting process. This is critical for normal CD manufacturing and is especially critical for the, new DVD video ROM or Audio discs where pit dimensions are one half their current values of 0.60 μm wide by 0.90–3.30 μm long.

As an alternative to the writing and reading lasers, respective LED light sources could be used.

It is to be noted that the arrangement shown herein is merely a schematic representation, the actual apparatus being far more sophisticated and including use of complex electronic and mechanical devices well known to those skilled in the art.

While a preferred embodiment of the present invention has been disclosed above, it is to be understood that this embodiment is given by example only and is not intended to limit or define the present invention. Those skilled in the art may make various additions, changes, modifications, and alterations to the preferred embodiment chosen to illustrate the invention without departing from the spirit and scope of the present contribution to the art.

What is claimed is:

1. A system for recording information in a read-after-write process of making optical discs, said system comprising:
   a recording chamber for containing a glassmaster
   a first light source for generating a writing light beam;
   a second light source for generating a reading light beam for reading data written on said glassmaster by said writing light beam;
   a photodetection system for detecting diffraction in said reading light beam caused by passing said reading light beam through said glass master; and
   a humidifier for controlling humidity in said recording chamber.

2. The system according to claim 1, further comprising an acousto-optical modulator which controls said first light source and writing light beam in response to a data stream which is being written by said writing light beam.

3. The system according to claim 1, wherein said first light source produces said writing light beam with a wavelength between about 351 nm and about 458 nm.

4. The system according to claim 1, wherein said photo-detection system comprises first and second photodetectors, said first photodetector having an optical axis parallel to said writing light beam and said second photodetector having an optical axis angled with respect to said optical axis of said first photodetector.

5. The system according to claim 4, wherein said optical axis of said second photodetector is angled 23° with respect to the optical axis of said first photodetector.

6. The system according to claim 1, wherein said second light source produces said reading light beam with a wavelength of about 635 nm.

7. The system according to claim 1, wherein said first light source is a blue argon-ion laser.

8. The system according to claim 1, wherein said second light source is a red HeNe laser.

9. The system according to claim 1, further comprising a wet vacuum for ablating developed portions of a coating of said glass master.

* * * * *